United States Patent
Wu (10) Patent No.: US 11,083,086 B2
(45) Date of Patent: Aug. 3, 2021

(54) PRINTED WIRING BOARD AND METHOD FOR MANUFACTURING PRINTED WIRING BOARD

(71) Applicant: IBIDEN CO., LTD., Ogaki (JP)

(72) Inventor: Youhong Wu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/269,194

(22) Filed: Feb. 6, 2019

(65) Prior Publication Data
US 2019/0246496 A1 Aug. 8, 2019

(30) Foreign Application Priority Data
Feb. 7, 2018 (JP) .............................. JP2018-020243

(51) Int. Cl.
*H05K 1/02* (2006.01)
*H01L 23/00* (2006.01)
(Continued)

(52) U.S. Cl.
CPC ............ *H05K 1/0298* (2013.01); *H01L 24/11* (2013.01); *H01L 24/14* (2013.01); *H05K 3/4007* (2013.01);
(Continued)

(58) Field of Classification Search
CPC ...... H05K 1/0298; H05K 3/24; H05K 3/3457; H05K 3/4007; H05K 3/4644; H05K 1/11; H05K 1/111; H05K 1/114; H05K 1/141; H05K 1/144; H05K 1/18; H05K 1/181; H05K 2201/0367; H05K 2201/0391; H05K 2201/09181; H05K 2201/09218; H05K 2201/09372; H05K 2201/09381;
(Continued)

(56) References Cited

U.S. PATENT DOCUMENTS

| 5,883,435 A * | 3/1999 | Geffken ................. H01L 24/06 257/758 |
| 2007/0096327 A1* | 5/2007 | Kawamura ....... H01L 23/49816 257/774 |

(Continued)

FOREIGN PATENT DOCUMENTS

JP 2000-323613 A 11/2000

*Primary Examiner* — Steven T Sawyer
*Assistant Examiner* — Paresh H Paghadal
(74) *Attorney, Agent, or Firm* — Oblon, McClelland, Maier & Neustadt, L.L.P.

(57) ABSTRACT

A printed wiring board includes a base insulating layer, a conductor layer including first and second pads, a solder resist layer covering the conductor layer and having first opening exposing the first pad and second opening exposing the second pad, a first bump including base plating layer in the first opening and top plating layer on the first base layer, and a second bump including base plating layer in the second opening and top plating layer on the base layer. The second opening has smaller diameter than the first opening, and the second bump has smaller diameter than the first bump. The first base layer has flat upper surface or first recess having depth of 20 μm or less in upper central portion. The second base layer has flat upper surface, raised portion in upper central portion, or second recess shallower than the first recess in the upper central portion.

20 Claims, 6 Drawing Sheets

(51) Int. Cl.
*H05K 3/46* (2006.01)
*H05K 3/40* (2006.01)
*H05K 3/34* (2006.01)
*H05K 1/18* (2006.01)
*H05K 1/14* (2006.01)
*H05K 1/11* (2006.01)

(52) U.S. Cl.
CPC .. *H05K 3/4644* (2013.01); *H01L 2224/13082* (2013.01); *H05K 1/11* (2013.01); *H05K 1/111* (2013.01); *H05K 1/114* (2013.01); *H05K 1/14* (2013.01); *H05K 1/141* (2013.01); *H05K 1/144* (2013.01); *H05K 1/18* (2013.01); *H05K 1/181* (2013.01); *H05K 3/3452* (2013.01); *H05K 2201/0367* (2013.01); *H05K 2201/0391* (2013.01); *H05K 2201/094* (2013.01); *H05K 2201/095* (2013.01); *H05K 2201/098* (2013.01); *H05K 2201/09181* (2013.01); *H05K 2201/09209* (2013.01); *H05K 2201/09218* (2013.01); *H05K 2201/09227* (2013.01); *H05K 2201/09372* (2013.01); *H05K 2201/09381* (2013.01); *H05K 2201/09409* (2013.01); *H05K 2201/09427* (2013.01)

(58) Field of Classification Search
CPC ... H05K 2201/094; H05K 2201/09409; H05K 2201/09427; H05K 2201/095; H05K 2201/098; H01L 24/11; H01L 24/14; H01L 2224/16227
See application file for complete search history.

(56) References Cited

U.S. PATENT DOCUMENTS

| | | | |
|---|---|---|---|
| 2007/0205520 A1* | 9/2007 | Chou | H01L 24/48 257/780 |
| 2008/0264681 A1* | 10/2008 | Iwai | H01L 21/4853 174/257 |
| 2010/0263923 A1* | 10/2010 | Kodani | H01L 21/4853 174/260 |
| 2011/0210444 A1* | 9/2011 | Jeng | H01L 23/49827 257/738 |
| 2012/0299161 A1* | 11/2012 | Chang | H01L 21/76837 257/632 |
| 2013/0087910 A1* | 4/2013 | Abdul Razak | H01L 24/16 257/737 |
| 2014/0061897 A1* | 3/2014 | Lin | H01L 24/14 257/737 |
| 2014/0151874 A1* | 6/2014 | Obu | H03F 3/195 257/737 |
| 2014/0167254 A1* | 6/2014 | Yu | H01L 24/11 257/737 |
| 2015/0021759 A1* | 1/2015 | Chen | H01L 24/81 257/737 |
| 2015/0267310 A1* | 9/2015 | Ikumoto | C25D 3/32 205/125 |
| 2016/0100484 A1* | 4/2016 | Kunieda | H05K 3/4007 174/257 |
| 2017/0250153 A1* | 8/2017 | Kikuchi | H01L 24/81 |
| 2019/0304942 A1* | 10/2019 | Takeuchi | H01L 23/49822 |

* cited by examiner

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2018-020243, filed Feb. 7, 2018, the entire contents of which are incorporated herein by reference.

BACKGROUND OF THE INVENTION

Field of the Invention

The present invention relates to a printed wiring board having plating bumps, and a method for manufacturing the printed wiring board having plating bumps.

Description of Background Art

Japanese Patent Laid-Open Publication No. 2000-323613 describes a printed wiring board in which multiple conductor pads are formed in a lowermost layer of a lower layer portion and a lower surface of the lowermost layer except for the conductor pads is covered by a solder resist layer. Bumps as external connection terminals are respectively formed on the conductor pads. The entire contents of this publication are incorporated herein by reference.

SUMMARY OF THE INVENTION

According to one aspect of the present invention, a printed wiring board includes a base insulating layer, a conductor layer formed on the base insulating layer and including a first conductor pad and a second conductor pad, a solder resist layer formed on the base insulating layer and covering the conductor layer such that the solder resist layer has a first opening exposing the first conductor pad and a second opening exposing the second conductor pad, a first bump formed on the first conductor pad and including a first base plating layer formed in the first opening of the solder resist layer and a first top plating layer formed on the first base plating layer, and a second bump formed on the second conductor pad and including a second base plating layer formed in the second opening of the solder resist layer and a second top plating layer formed on the second base plating layer. The solder resist layer is formed such that the second opening has a diameter smaller than a diameter of the first opening and that the second bump has a diameter smaller than a diameter of the first bump, the first bump is formed such that the first base plating layer has one of a flat upper surface and a first recess having a depth of 20 μm or less in an upper central portion, and the second bump is formed such that the second base plating layer has one of a flat upper surface, a raised portion in an upper central portion, and a second recess shallower than the first recess in the upper central portion.

According to another aspect of the present invention, a method for manufacturing a printed wiring board includes forming a conductor layer on a base insulating layer, forming a solder resist layer on the base insulating layer such that a first opening of the solder resist layer exposes a first conductor pad of the conductor layer and that a second opening of the solder resist layer has a diameter smaller than a diameter of the first opening and exposes a second conductor pad of the conductor layer, forming, on the first conductor pad of the conductor layer, a first bump including a first base plating layer in the first opening of the solder resist layer and a first top plating layer on the first base plating layer, and forming, on the second conductor pad of the conductor layer, a second bump including a second base plating layer in the second opening of the solder resist layer and forming a second top plating layer on the second base plating layer such that the second bump has a diameter smaller than a diameter of the first bump. The forming of the first bump includes forming the first base plating layer such that the first base plating layer has one of a flat upper surface and a first recess having a depth of 20 μm or less in an upper central portion, and the forming of the second bump includes forming the second base plating layer such that the second base plating layer has one of a flat upper surface, a raised portion in an upper central portion, and a second recess shallower than the first recess in the upper central portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
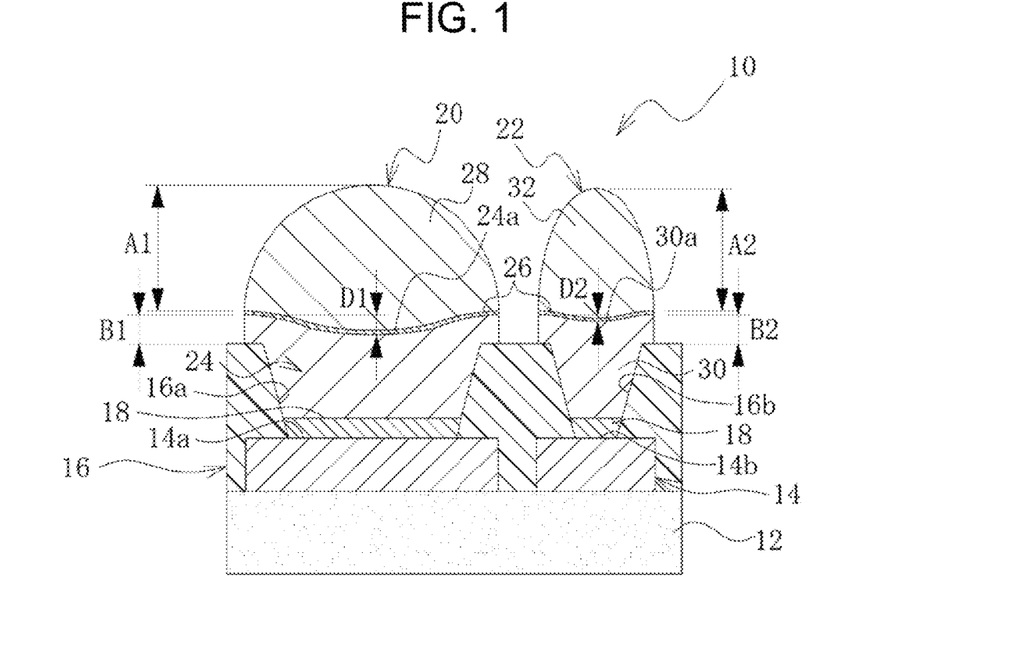
FIG. 1 is a cross-sectional view for describing a printed wiring board according to an embodiment of the present invention.

FIG. 1 illustrates an enlarged view of a portion of a printed wiring board 10 of the embodiment. The printed wiring board 10 may be a substrate with a core formed by alternately laminating conductor layers and resin insulating layers on one side or both sides of a core substrate (not illustrated in the drawings), the conductor layers each having a predetermined circuit pattern. In the case where the conductor layers are formed on both sides of the core substrate, conductor layers opposing each other via the core substrate may be connected to each other via through-hole conductors (not illustrated in the drawings). Alternatively, instead of a core substrate, the printed wiring board 10 may be a coreless substrate obtained by alternately laminating conductor layers and resin insulating layers on a support plate (not illustrated in the drawings) and then removing the support plate. In any case, as illustrated in FIG. 1, the printed wiring board 10 includes at least a base insulating layer 12 which is an outermost resin insulating layer, a conductor layer 14 which is formed on the base insulating layer 12 and has a predetermined circuit pattern, and a solder resist layer 16 which is formed on the base insulating layer 12 and the conductor layer 14. Other multiple conductor layers and resin insulating layers are often alternately formed below the base insulating layer 12, but are omitted in the drawings. However, it is also possible that the printed wiring board 10 is formed from one insulating layer (the base insulating layer 12) and one conductor layer (the conductor layer 14).

The base insulating layer 12 can be formed of, for example, a resin composition or the like containing an inorganic filler such as silica or alumina and an epoxy resin. The conductor layer 14 is formed of a conductive metal, for example, a metal containing copper as a main component.

The solder resist layer 16 has a first opening (16a) exposing a portion of the conductor layer 14 as a first conductor pad (14a) and a second opening (16b) having a smaller diameter than the first opening (16a) and exposing another portion of the conductor layer 14 as a second conductor pad (14b). An aspect ratio of the first opening (16a), that is, a ratio of a depth to a diameter at a bottom thereof can be set to 0.5 or less. An aspect ratio of the second opening (16b), that is, a ratio of a depth to a diameter at a bottom thereof can be set to 0.6 or more.

An underlayer 18 may be formed on each of the first and second conductor pads (14a, 14b). As the underlayer 18, a nickel layer formed on a surface of each of the first and second conductor pads (14a, 14b), a palladium layer formed on the nickel layer, and a gold layer formed on the palladium layer can be exemplified. In addition, a nickel layer and a gold layer formed on the nickel layer can be exemplified. It is also possible that the underlayer 18 is not formed.

The printed wiring board 10 further includes a first bump 20 which is formed on the first conductor pad (14a) via the underlayer 18, and a second bump 22 which is formed on the second conductor pad (14b) via the underlayer 18 and has a smaller diameter than the first bump 20. In the case where the underlayer 18 is not formed, the first and second bumps (20, 22) can be respectively formed directly on the first and second conductor pads (14a, 14b). The first bump 20 can be used for connecting to a power source or a ground line. The second bump 22 having a smaller diameter than the first bump 20 can be used for connecting to a signal line.

The first bump 20 has a first base plating layer 24 formed in the first opening (16a), and a first top plating layer 28 formed on the first base plating layer 24 via an intermediate layer 26 containing, for example, nickel as a main component. The intermediate layer 26 preferably has a thickness of 7 μm or less. It is also possible that the intermediate layer 26 is not formed. In the case where the intermediate layer 26 is not formed, the first top plating layer 28 can be formed directly on the first base plating layer 24.

The first base plating layer 24 is formed of a conductive metal, preferably a metal containing copper as a main component. The first base plating layer 24 is preferably formed to a height exceeding a surface of the solder resist layer 16 (a surface on an opposite side with respect to the base insulating layer 12). As a result, the first bump 20 is stably held in the first opening (16a). A thickness (B1) of the first base plating layer 24 measured from the surface of the solder resist layer 16 is preferably within a range of 3 μm-20 μm. The first base plating layer 24 has a first recess (24a) in an upper central portion thereof. That is, the upper central portion of the first base plating layer 24 is formed at a position lower than an upper outer peripheral portion thereof. A depth (D1) of the first recess (24a), that is, a distance from a highest position of the upper outer peripheral portion of the first base plating layer 24 to a bottom position of the recess is 20 μm or less. By reducing the depth (D1) of the first recess (24a), in some cases, when the first top plating layer 28 is formed on the first base plating layer 24 via the intermediate layer 26, gas accumulation in the first recess (24a) is suppressed. As a result, occurrence of voids in the first top plating layer 28 is reduced. The depth (D1) of the first recess (24a) is preferably 15 μm or less, and more preferably 10 μm or less.

The first top plating layer 28 is formed of a metal which has a melting point lower than that of the first base plating layer 24 and which is melted by a reflow treatment and is shaped into a substantially hemispherical shape as illustrated in FIG. 1, for example, a metal containing tin as a main component. A thickness (A1) of the first top plating layer 28 (a distance in a vertical direction from a lower end of the first top plating layer 28 to a top of the first top plating layer on an outer peripheral surface of the first bump 20) is preferably set in a range of 5 μm-45 μm. By setting the thickness (A1) of the first top plating layer 28 in this range, good connection reliability can be obtained between the first bump 20 and a connection pad (not illustrated in the drawings) of an electronic component such as a semiconductor chip or a memory mounted on the printed wiring board 10.

The second bump 22 has a second base plating layer 30 formed in the second opening (16b), and a second top plating layer 32 formed on the second base plating layer 30 via an intermediate layer 26 containing, for example, nickel as a main component. The intermediate layer 26 preferably has a thickness of 7 μm or less. It is also possible that the intermediate layer 26 is not formed. In the case where the intermediate layer 26 is not formed, the second top plating layer 32 can be formed directly on the second base plating layer 30.

The second base plating layer 30 is formed of a conductive metal, preferably a metal containing copper as a main component. The second base plating layer 30 is preferably formed to a height exceeding the surface of the solder resist layer 16 (the surface on an opposite side with respect to the base insulating layer 12). As a result, the second bump 22 is stably held in the second opening (16b). A thickness (B2) of the second base plating layer 30 measured from the surface of the solder resist layer 16 is preferably within a range of 3 μm-20 μm. The second base plating layer 30 has a second recess (30a) in an upper central portion thereof. That is, the upper central portion of the second base plating layer 30 is formed at a position lower than an upper outer peripheral portion thereof. A depth (D2) of the second recess (30a), that is, a distance from a highest position of the upper outer peripheral portion of the second base plating layer 30 to a bottom position of the second recess (30a) is smaller than the depth (D1) of the first recess (24a). In the second bump 22 having a smaller diameter than the first bump 20, by making the depth (D2) of the second recess (30a) smaller than the depth (D1) of the first recess (24a), in some cases, when the second top plating layer 32 is formed on the second base plating layer 30 via the intermediate layer 26, gas accumulation in the second recess (30a) can be suppressed. As a result, occurrence of voids in the second top plating layer 32 is reduced.

The second top plating layer 32 is formed of a metal which has a melting point lower than that of the second base plating layer 30 and which is melted by a reflow treatment and is shaped into a substantially hemispherical shape as illustrated in FIG. 1, for example, a metal containing tin as a main component. A thickness (A2) of the second top plating layer 32 (a distance in the vertical direction from a lower end of the second top plating layer 32 to a top of the second top plating layer 32 on an outer peripheral surface of the second bump 22) is preferably set in a range of 5 μm-45 μm. By setting the thickness (A2) of the second top plating layer 32 in this range, good connection reliability can be obtained between the second bump 22 and a connection pad (not illustrated in the drawings) of an electronic component such as a semiconductor chip or a memory mounted on the printed wiring board 10.

Figure 2:
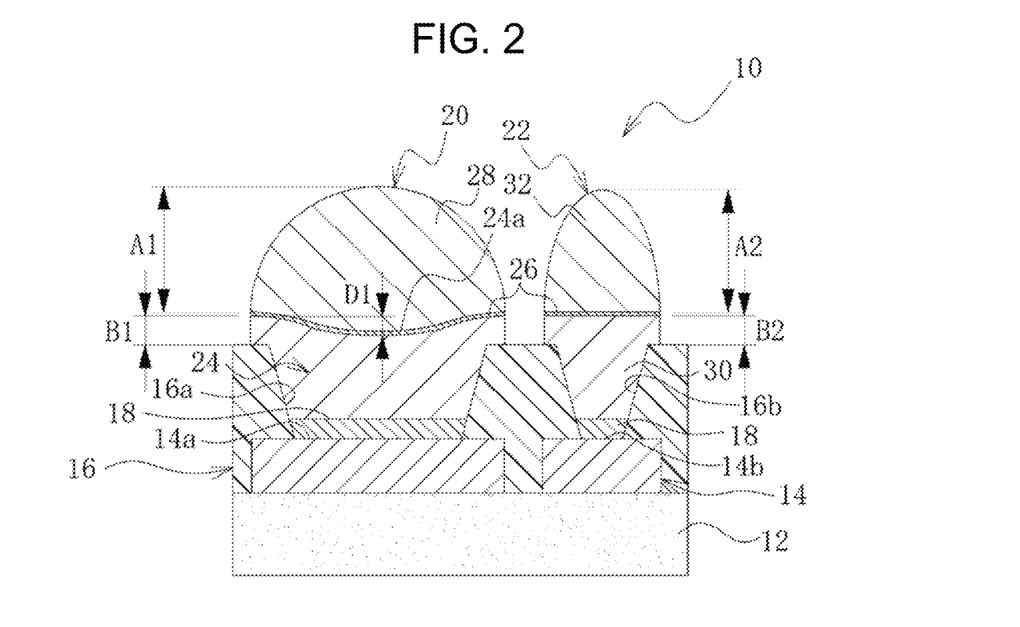
FIG. 2 is a cross-sectional view for describing a modified embodiment of the printed wiring board according to the embodiment of the present invention.

FIG. 2 illustrates a modified embodiment of the printed wiring board 10 illustrated in FIG. 1. Elements or portions same as elements or portions described with reference to FIG. 1 are denoted using the same reference numeral symbols, and detailed description thereof is omitted as appropriate. In the printed wiring board 10 according to this modified embodiment, the upper surface of the second base plating layer 30 of the second bump 22 is formed flat. Other structures thereof are the same as those of the printed wiring board 10 of FIG. 1. The term "flat" means that the upper surface of the second base plating layer 30 is substantially parallel to a main surface of the printed wiring board 10 and micro irregularities that can be generated by a plating treatment may be present. By flattening the upper surface of the second base plating layer 30, a void occurrence rate in the second bump 22 is reduced as compared to the second bump 22 illustrated in FIG. 1 which has the second recess (30a) in the upper central portion thereof.

Figure 3:
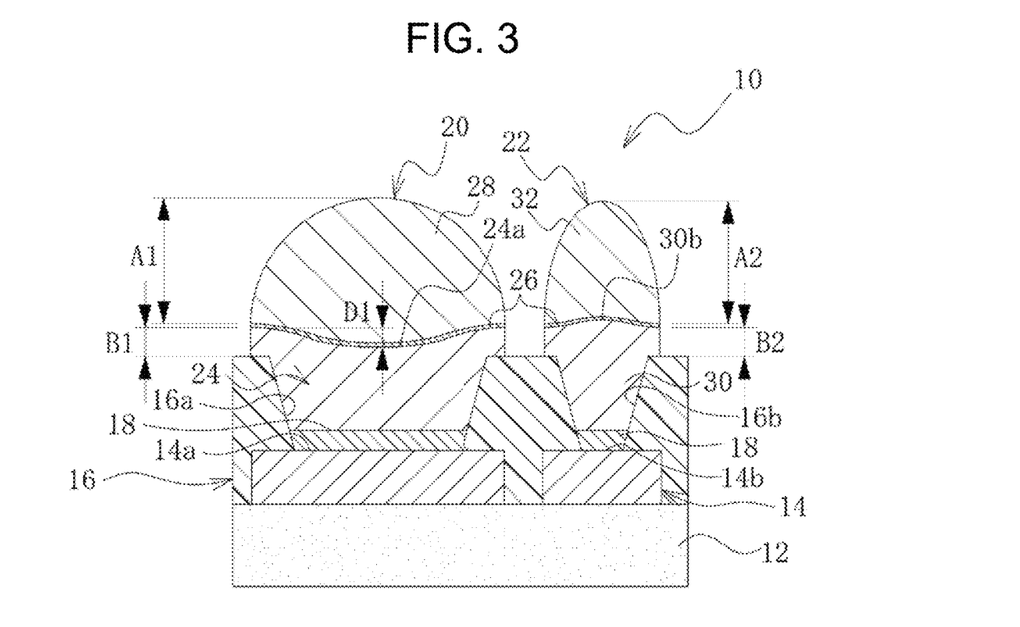
FIG. 3 is a cross-sectional view for describing a modified embodiment of the printed wiring board according to the embodiment of the present invention.

FIG. 3 illustrates a modified embodiment of the printed wiring board 10 illustrated in FIG. 1. Elements or portions same as elements or portions described with reference to FIG. 1 are denoted using the same reference numeral symbols, and detailed description thereof is omitted as appropriate. In the printed wiring board 10 according to this modified embodiment, a raised portion (30b) is formed in the upper central portion of the second base plating layer 30 of the second bump 22. That is, the upper central portion of the second base plating layer 30 is at a position higher than the upper outer peripheral portion thereof. Other structures thereof are the same as those of the printed wiring board 10 of FIG. 1. By forming the raised portion (30b) in the upper central portion of the second base plating layer 30, the void occurrence rate in the second bump 22 is reduced as compared to the second bump 22 illustrated in FIG. 1 or FIG. 2 having the second recess (30a) in the upper central portion or having a flat upper surface.

Figure 4:
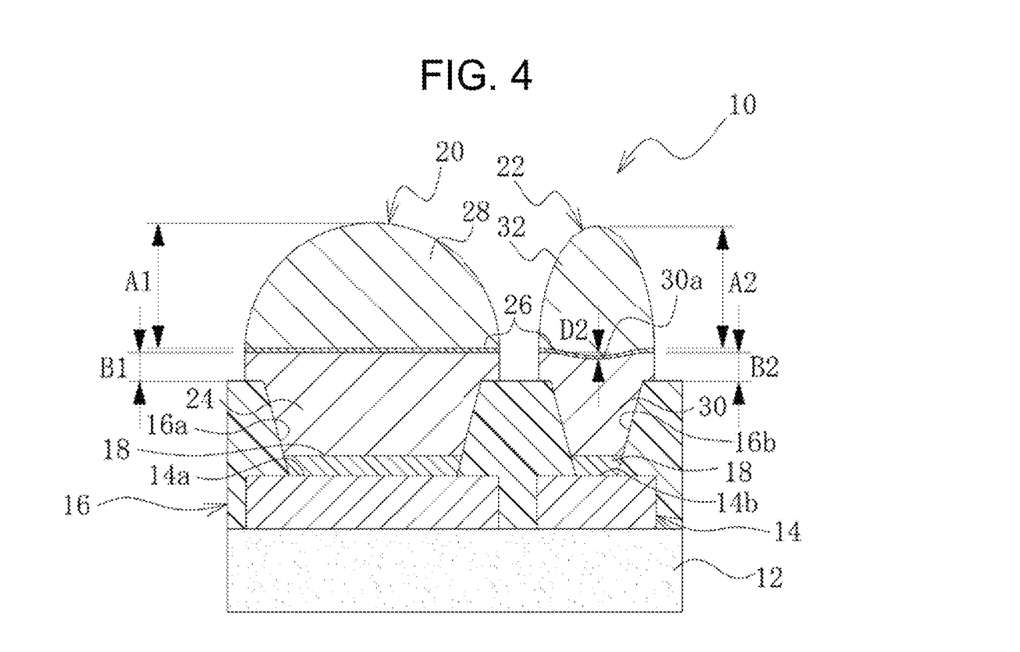
FIG. 4 is a cross-sectional view for describing a modified embodiment of the printed wiring board according to the embodiment of the present invention.

FIG. 4 illustrates a modified embodiment of the printed wiring board 10 illustrated in FIG. 1. Elements or portions same as elements or portions described with reference to FIG. 1 are denoted using the same reference numeral symbols, and detailed description thereof is omitted as appropriate. In the printed wiring board 10 according to this modified embodiment, the upper surface of the first base plating layer 24 of the first bump 20 is formed flat. Other structures thereof are the same as those of the printed wiring board 10 of FIG. 1. The term "flat" means that the upper surface of the first base plating layer 24 is substantially parallel to the main surface of the printed wiring board 10 and micro irregularities that can be generated by a plating treatment may be present. By flattening the upper surface of the first base plating layer 24, a void occurrence rate in the first bump 20 is reduced as compared to the first bump 20 illustrated in FIG. 1 which has the first recess (24a) in the upper central portion thereof.

Figure 5:
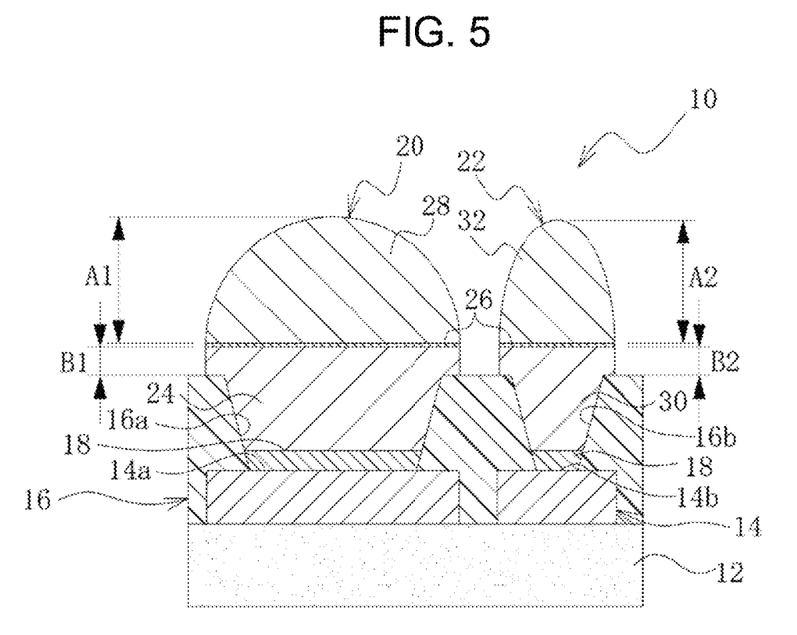
FIG. 5 is a cross-sectional view for describing a modified embodiment of the printed wiring board according to the embodiment of the present invention.

FIG. 5 illustrates a modified embodiment of the printed wiring board 10 illustrated in FIG. 1. Elements or portions same as elements or portions described with reference to FIG. 1 are denoted using the same reference numeral symbols, and detailed description thereof is omitted as appropriate. In the printed wiring board 10 according to this modified embodiment, the upper surface of the first base plating layer 24 of the first bump 20 is formed flat. Further, the upper surface of the second base plating layer 30 of the second bump 22 is also formed flat. Other structures thereof are the same as those of the printed wiring board 10 of FIG. 1. The term "flat" means that the upper surfaces of the first and second base plating layers (24, 30) are substantially parallel to the main surface of the printed wiring board 10 and micro irregularities that can be generated by a plating treatment may be present. By flattening the upper surfaces of the first and second base plating layers (24, 30), a void occurrence rate in the first and second bumps (20, 22) is reduced as compared to the first and second bumps (20, 22) illustrated in FIG. 1 which have the first and second recesses (24a, 30a) in the upper central portions thereof.

Figure 6:
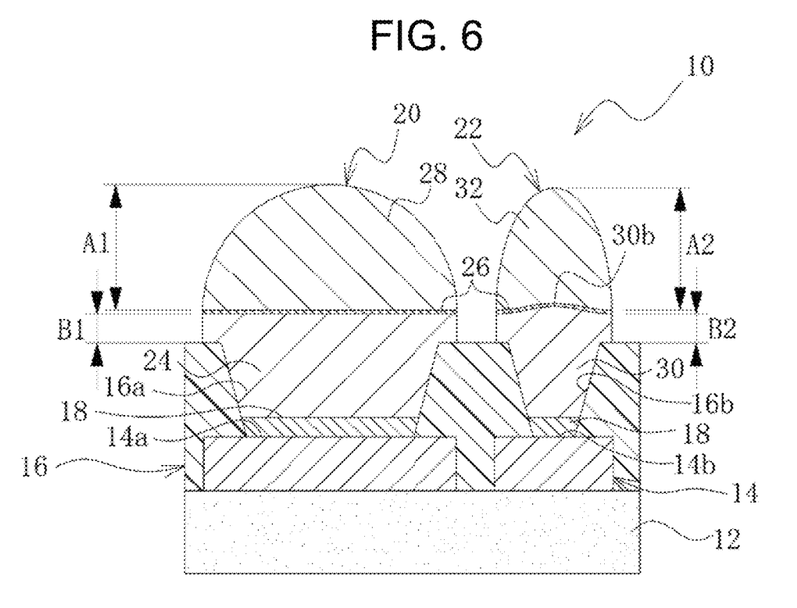
FIG. 6 is a cross-sectional view for describing a modified embodiment of the printed wiring board according to the embodiment of the present invention.

FIG. 6 illustrates a modified embodiment of the printed wiring board 10 illustrated in FIG. 1. Elements or portions same as elements or portions described with reference to FIG. 1 are denoted using the same reference numeral symbols, and detailed description thereof is omitted as appropriate. In the printed wiring board 10 according to this modified embodiment, the upper surface of the first base plating layer 24 of the first bump 20 is formed flat. The term "flat" means that the upper surface of the first base plating layer 24 is substantially parallel to the main surface of the printed wiring board 10 and micro irregularities that can be generated by a plating treatment may be present. A raised portion (30b) is formed in the upper central portion of the second base plating layer 30 of the second bump 22. That is, the upper central portion of the second base plating layer 30 is at a position higher than the upper outer peripheral portion thereof. Other structures thereof are the same as those of the printed wiring board 10 of FIG. 1. By flattening the upper surface of the first base plating layer 24, a void occurrence rate in the first bump 20 is reduced as compared to the first bump 20 illustrated in FIG. 1 which has the first recess (24a) in the upper central portion thereof. By forming the raised portion (30b) in the upper central portion of the second base plating layer 30, the void occurrence rate in the second bump 22 is reduced as compared to the second bump 22 illustrated in FIG. 1 or FIG. 2 having the second recess (30a) in the upper central portion or having a flat upper surface.

In the following, a method for manufacturing the printed wiring board 10 illustrated in FIG. 1 is described with reference to FIG. 7A-7H. The printed circuit boards 10 of the modified embodiments illustrated in FIG. 2-6 are also manufactured using the same manufacturing method.

Figure 7A:
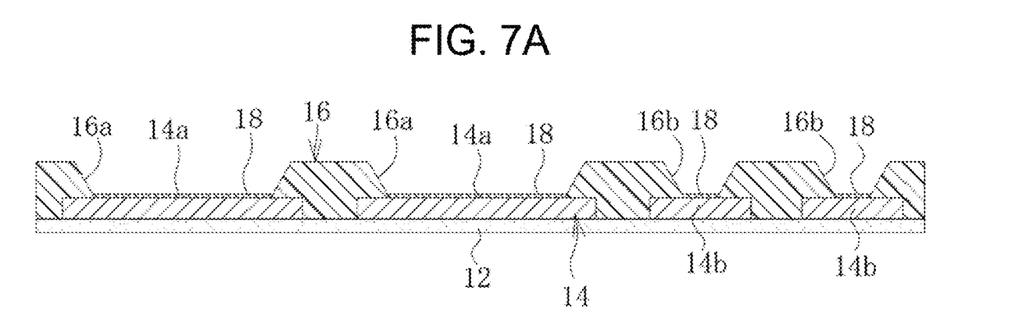
FIG. 7A-7H are cross-sectional views illustrating a method for manufacturing a printed wiring board according to an embodiment of the present invention.

FIG. 7A illustrates an intermediate in which the conductor layer 14 and the solder resist layer 16 are formed on the base insulating layer 12, the conductor layer 14 having a predetermined circuit pattern. Other multiple conductor layers and resin insulating layers are often alternately formed below the base insulating layer 12, but are omitted in the drawings. The multiple conductor layers and resin insulating layers can be laminated on a core substrate or on a support plate that can be removed afterwards. However, it is also possible that the printed wiring board 10 is formed from one resin insulating layer as the base insulating layer 12 and one conductor layer as the conductor layer 14. In this case, the resin insulating layer corresponds to the base insulating layer 12. For the base insulating layer 12, an insulating resin film for a build-up layer containing an inorganic filler such as silica or alumina and an epoxy resin can be used. In the solder resist layer 16, for example, using carbon dioxide gas laser or UV-YAG laser or the like, the first opening (16a) exposing a portion of the conductor layer 14 as the first conductor pad (14a) and the second opening (16b) exposing another portion of the conductor layer 14 as the second conductor pad (14b) are formed. The first opening (16a) preferably has an aspect ratio or 0.5 or less and the second opening (16b) preferably has an aspect ratio of 0.6 or more. On each of the first and second conductor pads (14a, 14b), an underlayer 18 is formed, for example, by laminating in this order a nickel layer, a palladium layer, and a gold layer by plating. It is also possible that the underlayer 18 is not formed.

Figure 7B:
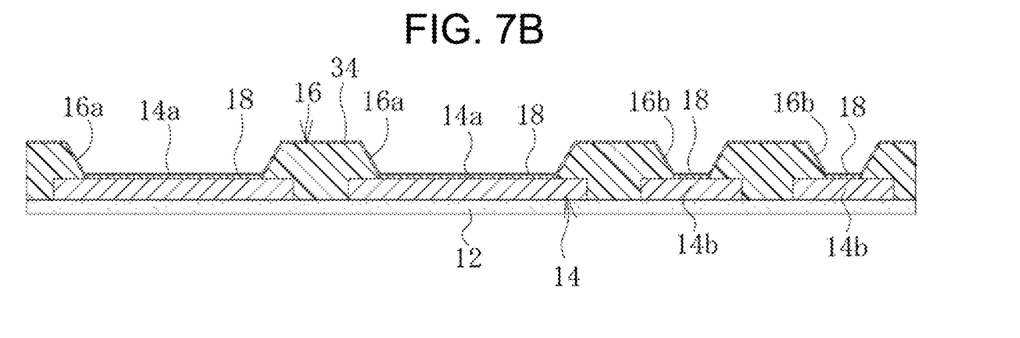

As illustrated in FIG. 7B, for example, an electroless plating treatment such as an electroless copper plating treatment is performed, and a seed layer 34 is formed on a surface of the intermediate (the surface of the solder resist layer 16 and side surfaces of the first and second openings (16a, 16b)) and on surfaces of the underlayers 18 (in the case where the underlayers 18 are not formed, on the conductor pads (14a, 14b)).

Figure 7C:
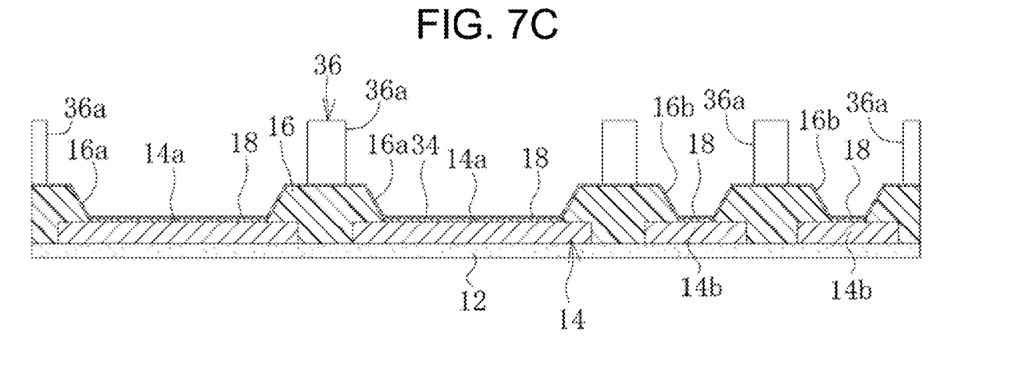

As illustrated in FIG. 7C, on the seed layer 34, a plating resist 36 of a predetermined pattern having openings (36a) at planed formation positions of the first and second bumps (20, 22) (FIG. 1) is formed.

Figure 7D:
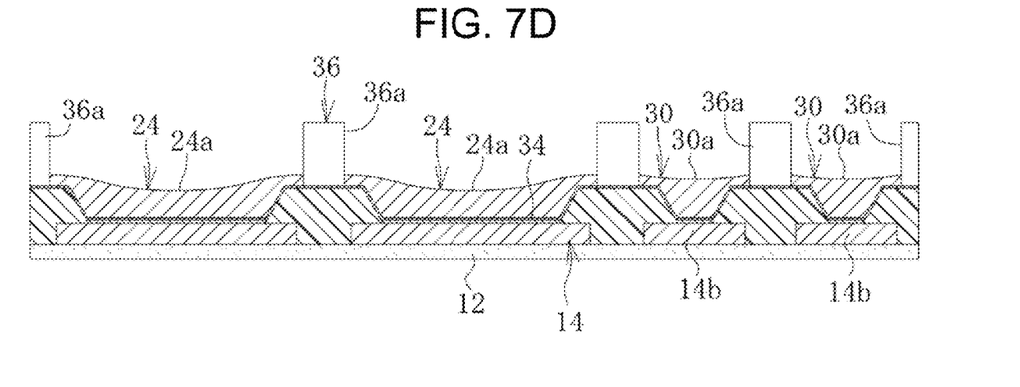

As illustrated in FIG. 7D, an electrolytic plating treatment is performed, and, on portions of the seed layer 34 exposed from the plating resist 36, the first base plating layer 24 and the second base plating layer 30, containing, for example, copper as a main component, are formed. In this case, when the printed wiring boards 10 illustrated in FIG. 1-3 are manufactured, a plating thickness of the first base plating layer 24 is adjusted such that the first recess (24a) having a depth of 20 μm or less, preferably 15 μm or less, more preferably 10 μm or less is formed in the upper central portion. When the printed wiring boards illustrated in FIG. 4-6 are manufactured, the plating thickness of the first base plating layer 24 is adjusted such that the upper surface of the first base plating layer 24 is flat. Further, when the printed wiring boards 10 illustrated in FIGS. 1 and 4 are manufactured, a plating thickness of the second base plating layer 30 is adjusted such that the second recess (30a) shallower than the first recess (24a) is formed in the upper central portion. When the printed wiring boards illustrated in FIGS. 2 and 5 are manufactured, the plating thickness of the second base plating layer 30 is adjusted such that the upper surface of the second base plating layer 30 is flat. When the printed wiring boards illustrated in FIGS. 3 and 6 are manufactured, the plating thickness of the second base plating layer 30 is adjusted such that the raised portion (30b) is formed in the upper central portion of the second base plating layer 30.

Further, when the first and second base plating layers (24, 30) are formed, the plating thicknesses of the first and second base plating layers (24, 30) are preferably adjusted such that the thickness of the first base plating layer 24 and the thickness of the second base plating layer 30, measured from the surface of the solder resist layer 16, are within a range of 3 μm-20 μm.

Figure 7E:
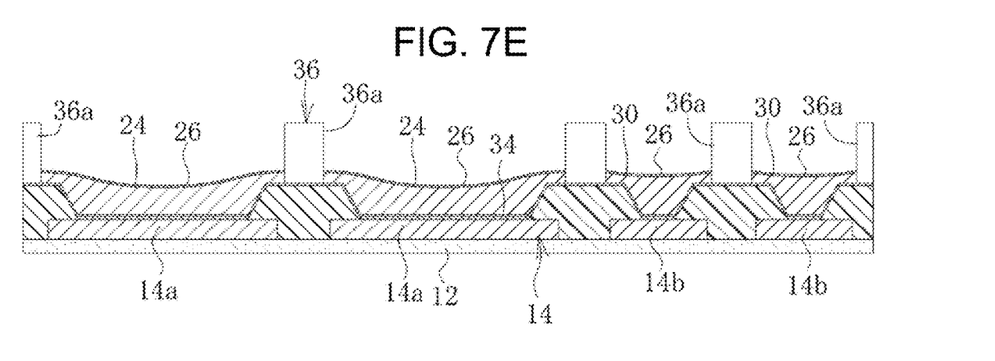

As illustrated in FIG. 7E, for example, an electrolytic plating treatment is performed, and the intermediate layer 26 containing, for example, nickel as a main component is formed on the first and second base plating layers (24, 30). The intermediate layer 26 preferably has a thickness of 7 μm or less. It is also possible that the intermediate layer 26 is not formed.

Figure 7F:
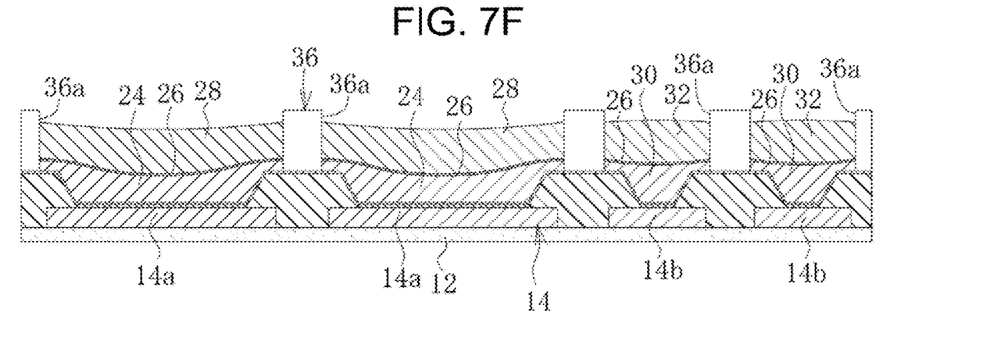

As illustrated in FIG. 7F, an electrolytic plating treatment is performed, and the first and second top plating layers (28, 32) are formed on the first and second base plating layers (24, 30) via the intermediate layer 26. The first and second top plating layers (28, 32) are formed of a metal which has a melting point lower than that of the first and second base plating layers (24, 30) and which is melted by a reflow treatment and is shaped into a substantially hemispherical shape, for example, a metal containing tin as a main component. The first and second top plating layers (28, 32) preferably each have a thickness in a range of 5 μm-45 μm. By flattening the upper surface of the first base plating layer 24 or by forming the first recess (24a) having the depth (D1) of 20 μm or less in the upper central portion, when the first top plating layer 28 is formed, gas accumulation in the first recess (24a) is suppressed. As a result, occurrence of voids in the first top plating layer 28 is reduced. Further, by flattening the upper surface of the second base plating layer 30 or by forming the second recess (30a) shallower than the first recess (24a) in the upper central portion, or by forming the raised portion (30b) in the upper central portion, when the second top plating layer 32 is formed, gas accumulation near the second base plating layer 30 is suppressed. As a result, occurrence of voids in the second top plating layer 32 is reduced.

Figure 7G:
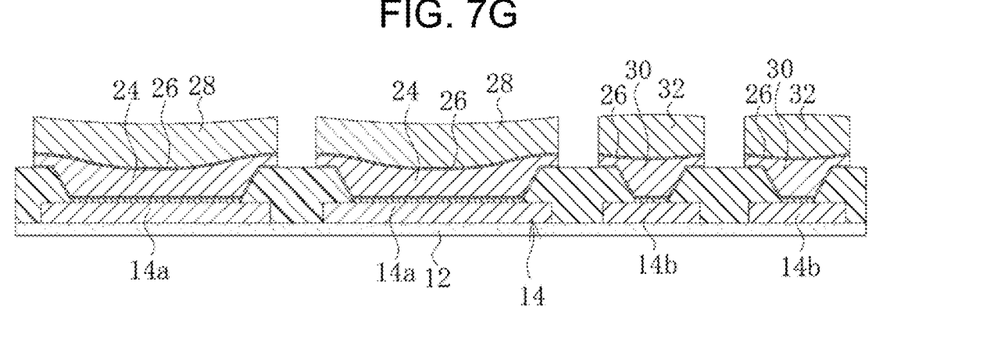

As illustrated in FIG. 7G, the plating resist 36 is peeled off. Further, a portion of the seed layer 34 exposed by the removal of the plating resist 36 is removed by etching.

Figure 7H:
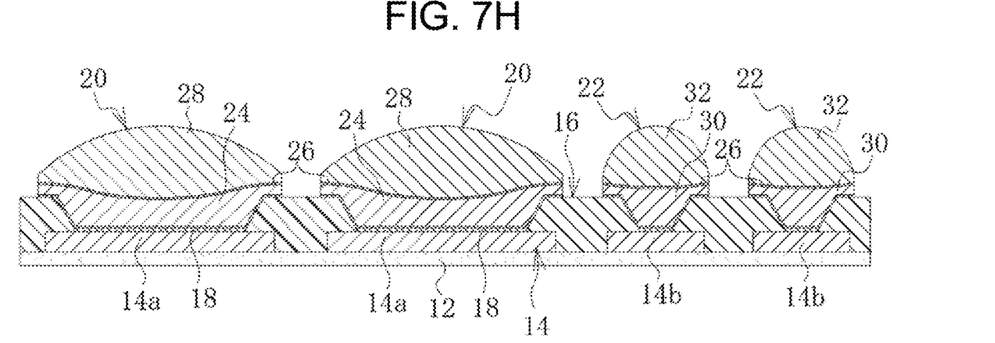

As illustrated in FIG. 7H, a reflow treatment is performed, and the first top plating layer 28 and the second top plating layer 32 are shaped into substantially hemispherical shapes. By the reflow treatment, in the case where the intermediate layer 26 is formed, the first bump 20 and the second bump 22 each including a copper layer, a copper/nickel alloy layer, a nickel layer, a nickel/tin alloy layer and a tin layer from a side close to the first and second conductor pads (14a, 14b) are formed. In the case where the intermediate layer 26 is not formed, the first bump 20 and the second bump 22 each including a copper layer, a copper/tin alloy layer, and a tin layer from a side close to the first and second conductor pads (14a, 14b) are formed.

Figure 8:
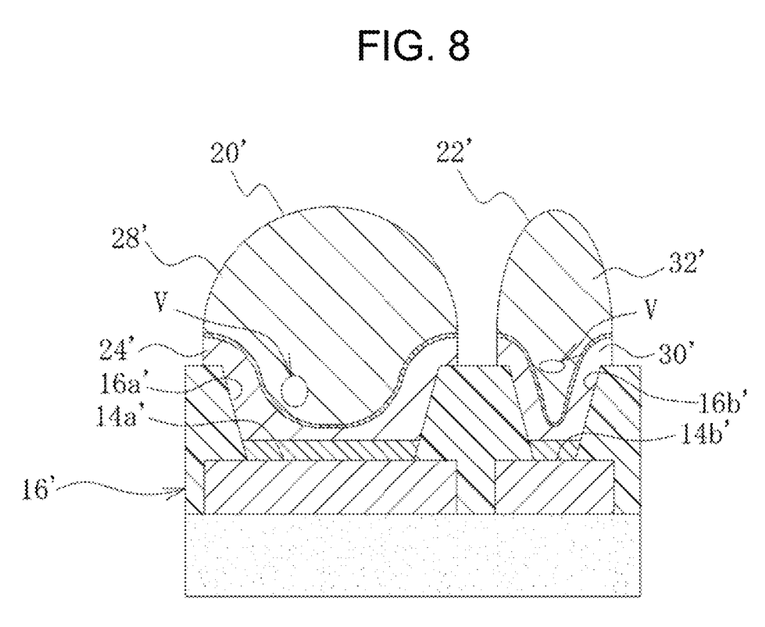
FIG. 8 is a cross-sectional view for describing how voids are generated in bumps in a printed wiring board according to a conventional technology.

Various bump formation methods such as printing, ball mounting, and paste filling are studied. However, in order to cope with a narrow pitch pattern, bump formation using a plating method is effective. However, in bump formation using a plating method, voids may be generated in bumps. In particular, as illustrated in FIG. 8, when bumps (20', 22') of different sizes are respectively formed on conductor pads (14a', 14b') in openings (16a', 16b') of different sizes formed in a solder resist layer (16') by forming base plating layers (24', 30') and forming top plating layers (28', 32') on the base plating layers (24', 30'), it has been found that voids (V) are likely to occur in the top plating layers (28', 32').

A printed wiring board according to an embodiment of the present invention includes: a base insulating layer; a conductor layer that is formed on the base insulating layer; a solder resist layer that is formed on the base insulating layer and on the conductor layer and has a first opening exposing a portion of the conductor layer as a first conductor pad and a second opening having a smaller diameter than the first opening and exposing another portion of the conductor layer as a second conductor pad; a first bump that is formed on the first conductor pad; and a second bump that is formed on the second conductor pad and has a smaller diameter than the first bump. The first bump has a first base plating layer formed in the first opening and a first top plating layer formed on the first base plating layer. The second bump has a second base plating layer formed in the second opening and a second top plating layer formed on the second base plating layer. The first base plating layer has a flat upper surface or has a first recess having a depth of 20 μm or less in an upper central portion. The second base plating layer has a flat upper surface, or has a raised portion in an upper central portion, or has a second recess in the upper central portion, the second recess being shallower than the first recess.

A method for manufacturing a printed wiring board according to an embodiment of the present invention includes: forming a base insulating layer; forming a conductor layer on the base insulating layer; forming a solder resist layer on the base insulating layer and on the conductor layer; forming a first opening in the solder resist layer, the first opening exposing a portion of the conductor layer as a first conductor pad; forming a second opening in the solder resist layer, the second opening having a smaller diameter than the first opening and exposing another portion of the conductor layer as a second conductor pad; forming a first bump on the first conductor pad; and forming a second bump on the second conductor pad, the second bump having a smaller diameter than the first bump. Forming the first bump includes forming a first base plating layer in the first opening and forming a first top plating layer on the first base plating layer. Forming the second bump includes forming a second base plating layer in the second opening and forming a second top plating layer on the second base plating layer. Forming the first base plating layer includes forming a first base plating layer having a flat upper surface or having a first recess having a depth of 20 μm or less in an upper central portion. Forming the second base plating layer includes forming a second base plating layer having a flat upper surface, or having a raised portion in an upper central portion, or having a second recess in the upper central portion, the second recess being shallower than the first recess.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a base insulating layer;
   a conductor layer formed on a surface of the base insulating layer and including a first conductor pad and a second conductor pad such that the first and second conductor pads have a same thickness;
   a solder resist layer formed on the surface of the base insulating layer and covering the conductor layer such that the solder resist layer has a first opening exposing the first conductor pad and a second opening exposing the second conductor pad;
   a first bump formed on the first conductor pad and comprising a first base plating layer formed in the first opening of the solder resist layer and a first top plating layer formed on the first base plating layer; and
   a second bump formed on the second conductor pad and comprising a second base plating layer formed in the second opening of the solder resist layer and a second top plating layer formed on the second base plating layer,
   wherein the solder resist layer is formed such that the second opening has a diameter smaller than a diameter of the first opening, that the second bump has a diameter smaller than a diameter of the first bump, that the first opening has an aspect ratio of 0.5 or less, and that the second opening has an aspect ratio of 0.6 or greater, the first bump is formed such that the first base plating layer has a first recess having a depth of 20 μm or less in an upper central portion, and the second bump is formed such that the second base plating layer has a second recess shallower than the first recess in the upper central portion.

2. The printed wiring board according to claim 1, wherein the first bump is formed such that the first top plating layer has a thickness in a range of 5 μm to 45 μm, and the second bump is formed such that the second top plating layer has a thickness in a range of 5 μm to 45 μm.

3. The printed wiring board according to claim 1, wherein the first bump is formed such that the first base plating layer comprises a metal comprising copper as a main component, and the second bump is formed such that the second base plating layer comprises a metal comprising copper as a main component.

4. The printed wiring board according to claim 1, wherein the first bump is formed such that the first top plating layer comprises a metal comprising tin as a main component, and the second bump is formed such that the second top plating layer comprises a metal comprising tin as a main component.

5. The printed wiring board according to claim 1, further comprising:
   an underlayer including a nickel layer, a palladium layer and a gold layer formed such that the underlayer is positioned between the first base plating layer of the first bump and the first conductor pad of the conductor layer and between the second base plating layer of the first bump and the second conductor pad of the conductor layer.

6. The printed wiring board according to claim 1, wherein the first bump includes an intermediate layer comprising nickel as a main component between the first base plating layer and the first top plating layer, and the second bump includes an intermediate layer comprising nickel as a main component between the second base plating layer and the second top plating layer.

7. The printed wiring board according to claim 6, wherein the intermediate layer of the first bump has a thickness of 7 μm or less, and the intermediate layer of the second bump has a thickness of 7 μm or less.

8. The printed wiring board according to claim 1, wherein the first bump is formed such that the first base plating layer has a height exceeding a surface of the solder resist layer, and a thickness measured from the surface of the solder resist layer within a range of 3 μm to 20 μm, and the second bump is formed such that the second base plating layer has a height exceeding a surface of the solder resist layer, and a thickness measured from the surface of the solder resist layer within a range of 3 μm to 20 μm.

9. The printed wiring board according to claim 1, wherein the first and second bumps are formed such that the first and second base plating layers have a thickness adjusted to be in a range of 3 μm to 20 μm measured from a surface of the solder resist layer.

10. The printed wiring board according to claim 2, wherein the first bump is formed such that the first base plating layer comprises a metal comprising copper as a main component, and the second bump is formed such that the second base plating layer comprises a metal comprising copper as a main component.

11. The printed wiring board according to claim 10, wherein the first bump is formed such that the first top plating layer comprises a metal comprising tin as a main component, and the second bump is formed such that the second top plating layer comprises a metal comprising tin as a main component.

12. A method for manufacturing a printed wiring board, comprising:
forming a conductor layer on a surface of a base insulating layer such that the conductor layer includes a first conductor pad and a second conductor pad and that the first and second conductor pads have a same thickness;
forming a solder resist layer on the surface of the base insulating layer such that a first opening of the solder resist layer exposes the first conductor pad of the conductor layer and that a second opening of the solder resist layer has a diameter smaller than a diameter of the first opening and exposes the second conductor pad of the conductor layer;
forming, on the first conductor pad of the conductor layer, a first bump comprising a first base plating layer in the first opening of the solder resist layer and a first top plating layer on the first base plating layer; and
forming, on the second conductor pad of the conductor layer, a second bump comprising a second base plating layer in the second opening of the solder resist layer and forming a second top plating layer on the second base plating layer such that the second bump has a diameter smaller than a diameter of the first bump,
wherein the forming of the solder resist layer comprises forming the solder resist layer such that the first opening has an aspect ratio of 0.5 or less, and that the second opening has an aspect ratio of 0.6 or greater, the forming of the first bump includes forming the first base plating layer such that the first base plating layer has a first recess having a depth of 20 μm or less in an upper central portion, and the forming of the second bump includes forming the second base plating layer such that the second base plating layer has a second recess shallower than the first recess in the upper central portion.

13. The method for manufacturing a printed wiring board according to claim 12, wherein the first bump is formed such that the first top plating layer has a thickness in a range of 5 μm to 45 μm, and the second bump is formed such that the second top plating layer has a thickness in a range of 5 μm to 45 μm.

14. The method for manufacturing a printed wiring board according to claim 12, wherein the first bump is formed such that the first base plating layer comprises a metal comprising copper as a main component, and the second bump is formed such that the second base plating layer comprises a metal comprising copper as a main component.

15. The method for manufacturing a printed wiring board according to claim 12, wherein the first bump is formed such that the first top plating layer comprises a metal comprising tin as a main component, and the second bump is formed such that the second top plating layer comprises a metal comprising tin as a main component.

16. The method for manufacturing a printed wiring board according to claim 12, further comprising:
forming an underlayer including a nickel layer, a palladium layer and a gold layer such that the underlayer is positioned between the first base plating layer of the first bump and the first conductor pad of the conductor layer and between the second base plating layer of the first bump and the second conductor pad of the conductor layer.

17. The method for manufacturing a printed wiring board according to claim 12, wherein the forming of the first bump includes forming an intermediate layer comprising nickel as a main component between the first base plating layer and the first top plating layer, and the forming of the second bump includes forming an intermediate layer comprising nickel as a main component between the second base plating layer and the second top plating layer.

18. The method for manufacturing a printed wiring board according to claim 17, wherein the forming of the first bump includes forming the intermediate layer having a thickness of 7 μm or less, and the forming of the second bump includes forming the intermediate layer having a thickness of 7 μm or less.

19. The method for manufacturing a printed wiring board according to claim 12, wherein the first bump is formed such that the first base plating layer has a height exceeding a surface of the solder resist layer, and a thickness measured from the surface of the solder resist layer within a range of 3 μm to 20 μm, and the second bump is formed such that the second base plating layer has a height exceeding a surface of the solder resist layer, and a thickness measured from the surface of the solder resist layer within a range of 3 μm to 20 μm.

20. The method for manufacturing a printed wiring board according to claim 12, wherein the first and second bumps are formed such that the first and second base plating layers have a thickness adjusted to be in a range of 3 μm to 20 μm measured from a surface of the solder resist layer.

* * * * *